US012588372B2

(12) United States Patent
Chen

(10) Patent No.: US 12,588,372 B2
(45) Date of Patent: Mar. 24, 2026

(54) DISPLAY DEVICE AND ELECTRONIC EQUIPMENT

(71) Applicant: WUHAN CHINA STAR OPTOELECTRONICS SEMICONDUCTOR DISPLAY TECHNOLOGY CO., LTD., Wuhan (CN)

(72) Inventor: Tao Chen, Wuhan (CN)

( * ) Notice: Subject to any disclaimer, the term of this patent is extended or adjusted under 35 U.S.C. 154(b) by 441 days.

(21) Appl. No.: 17/274,192

(22) PCT Filed: Dec. 25, 2020

(86) PCT No.: PCT/CN2020/139222
§ 371 (c)(1),
(2) Date: Jun. 11, 2023

(87) PCT Pub. No.: WO2022/095252
PCT Pub. Date: May 12, 2022

(65) Prior Publication Data
US 2023/0329048 A1 Oct. 12, 2023

(30) Foreign Application Priority Data
Nov. 5, 2020 (CN) .......................... 202011225042.7

(51) Int. Cl.
*H10K 59/131* (2023.01)
(52) U.S. Cl.
CPC ................................. *H10K 59/131* (2023.02)
(58) Field of Classification Search
CPC .................................................. H10K 59/131
See application file for complete search history.

(56) References Cited

U.S. PATENT DOCUMENTS

2020/0279531 A1 9/2020 Yang et al.
2021/0020112 A1* 1/2021 Ueno ................... G09G 3/3233

FOREIGN PATENT DOCUMENTS

| CN | 108520888 A | 9/2018 |
| CN | 208271493 U | 12/2018 |
| CN | 109767689 A | 5/2019 |
| CN | 110489012 A | 11/2019 |
| CN | 110491917 A | 11/2019 |
| CN | 110492018 A | 11/2019 |
| CN | 210182387 U | 3/2020 |
| CN | 112102783 A | 12/2020 |
| CN | 112103329 A | 12/2020 |

(Continued)

OTHER PUBLICATIONS

International Search Report in International application No. PCT/CN2020/139222,mailed on Jul. 26, 2021.

(Continued)

*Primary Examiner* — Douglas M Menz

(57) ABSTRACT

The present invention provides a display device and an electronic equipment. By arranging connecting sections of a plurality of first signal lines between a plurality of pixel driving circuit islands and a display light-transmitting region, a wiring method of connecting the connecting sections of the plurality of first signal lines and corresponding pixel driving circuit islands is simplified, a problem of uneven display of the display device is alleviated, and a display effect of the electronic equipment is improved.

17 Claims, 6 Drawing Sheets

(56)             References Cited

FOREIGN PATENT DOCUMENTS

CN          213878097  U       8/2021

OTHER PUBLICATIONS

Written Opinion of the International Search Authority in International application No. PCT/CN2020/139222, mailed on Jul. 26, 2021.

Chinese Office Action issued in corresponding Chinese Patent Application No. 202011225042.7 dated Jul. 11, 2024, pp. 1-13.

* cited by examiner

101

1011

DISPLAY DEVICE AND ELECTRONIC EQUIPMENT

TECHNICAL FIELD

The present invention relates to the field of display technology and in particular to a display device and an electronic equipment.

BACKGROUND OF INVENTION

At present, applying transparent display designs to under-screen camera regions of active matrix organic light-emitting diode (AMOLED) display panels to achieve full-screen design is one of the research focuses.

A Chinese patent application filed by the applicant with a publication number CN110491917A increases light transmission of a light-transmitting region by arranging pixel driving circuit islands and first signal lines and second signal lines electrically connected to a plurality of pixel driving circuit islands outside the light-transmitting region. However, the applicant found that, a wiring method of second circuitous sections of the plurality of second signal lines and arrangement of the pixel driving circuit islands will cause a problem that when the second circuitous sections of the plurality of second signal lines are connected to corresponding pixel driving circuit islands, there is a need to change the wirings, resulting in complex wiring, and designs of the second circuitous sections of the plurality of second signal lines may cause a problem of uneven display in a main display region.

Therefore, it is necessary to propose a technical solution to solve the problem of uneven display in the main display region and complex wiring of the second signal lines surrounding the light-transmitting region.

SUMMARY OF INVENTION

Technical Problems

The purpose of the present invention is to provide a display device and an electronic equipment, which can relieve the problem of uneven display in the main display region of the display device and the electronic equipment with a display light-transmitting region, and simplify the wiring of first signal lines surrounding the display light-transmitting region, thereby simplifying a manufacturing process.

SOLUTIONS TO TECHNICAL PROBLEM

Technical Solutions

In order to achieve the above object, the present invention provides a display device comprising a display light-transmitting region, a main display region, and a transition display region, the transition display region is arranged between the display light-transmitting region and the main display region, the display device comprises:

a plurality of first display pixels provided in the main display region;

a plurality of second display pixels provided in the display light-transmitting region and the transition display region;

a plurality of pixel driving circuit islands provided in the transition display region and arranged around the display light-transmitting region, each of the plurality of pixel driving circuit islands comprises a plurality of pixel driving circuits, and the pixel driving circuits of the plurality of pixel driving circuit islands are configured to drive the plurality of second display pixels to emit light; and a plurality of first signal lines, each of the plurality of first signal lines comprises a connecting section, and the connecting sections of the plurality of first signal lines are disposed between the plurality of pixel driving circuit islands and the display light-transmitting region and are connected to the plurality of pixel driving circuit islands.

In the above display device, each of the plurality of first signal lines further comprises a transition section, and the transition sections of the plurality of first signal lines are disposed between the plurality of pixel driving circuit islands and the main display region and are connected to the plurality of pixel driving circuit islands.

In the above display device, the display light-transmitting region is symmetrically arranged about a first symmetry axis and a second symmetry axis, and the first symmetry axis is perpendicular to the second symmetry axis, the plurality of pixel driving circuit islands comprise a first group of pixel driving circuit islands and a second group of pixel driving circuit islands, and the pixel driving circuit islands in the first group of pixel driving circuit islands and the pixel driving circuit islands in the second group of pixel driving circuit islands are symmetrically arranged about the second symmetry axis;

the pixel driving circuit islands in the first group of pixel driving circuit islands are symmetrically arranged about the first symmetry axis, and the pixel driving circuit islands in the second group of pixel driving circuit islands are symmetrically arranged about the first symmetry axis; and wherein the connecting section of each of the plurality of first signal lines is connected between one of the pixel driving circuit islands in the first group of pixel driving circuit islands and a corresponding one of the pixel driving circuit islands in the second group of pixel driving circuit islands.

In the above display device, the display light-transmitting region has an arc-shaped boundary, and a number of the pixel driving circuits in at least part of the pixel driving circuit islands of the first group of pixel driving circuit islands decreases in a direction from close to the first symmetry axis to away from the first symmetry axis; and a number of the pixel driving circuits in at least part of the pixel driving circuit islands of the second group of pixel driving circuit islands decreases in the direction from close to the first symmetry axis to away from the first symmetry axis.

In the above display device, the plurality of pixel driving circuit islands are in a strip shape, and the plurality of pixel driving circuit islands are same in width;

a height of at least part of the pixel driving circuit islands of the first group of pixel driving circuit islands decreases in the direction from close to the first symmetry axis to away from the first symmetry axis; and a height of at least part of the pixel driving circuit islands of the second group of pixel driving circuit islands decreases in the direction from close to the first symmetry axis to away from the first symmetry axis.

In the above display device, a part of adjacent ones of the pixel driving circuit islands in the first group of pixel driving circuit islands close to the first symmetry axis are same in height, and a part of adjacent ones of the pixel driving circuit islands in the second group of pixel driving circuit islands close to the first symmetry axis are same in height.

In the above display device, spacings between any adjacent two of at least part of the pixel driving circuit islands in the first group of pixel driving circuit islands are equal; and spacings between any adjacent two of at least part of the pixel driving circuit islands in the second group of pixel driving circuit islands are equal.

In the above display device, spacings between at least part of the pixel driving circuit islands in the first group of pixel driving circuit islands and corresponding one of the pixel driving circuit islands in the second group of pixel driving circuit islands decrease in a direction from close to the first symmetry axis to away from the first symmetry axis.

In the above display device, the first group of pixel driving circuit islands comprises a first pixel driving circuit island and a adjacently arranged second pixel driving circuit island that are adjacent to the first symmetry axis, the second group of pixel driving circuit islands comprises a third pixel driving circuit island arranged corresponding to the first pixel driving circuit island and a fourth pixel driving circuit island arranged corresponding to the second pixel driving circuit island, a spacing between the first pixel driving circuit island and the third pixel driving circuit island is equal to a spacing between the second pixel driving circuit island and the fourth pixel driving circuit island.

In the above display device, a shape of the display light-transmitting region is a circle, the connecting sections of the plurality of first signal lines comprise a first group of circuitous connecting sections and a second group of circuitous connecting sections, the first group of circuitous connecting sections and the second group of circuitous connecting sections are arranged on opposite sides of the display light-transmitting region and are symmetrically arranged about the first symmetry axis, the first group of circuitous connecting sections and the second group of circuitous connecting sections are both arranged around the display light-transmitting region, and the first group of circuitous connecting sections and the second group of circuitous connecting sections are both arranged between the display light-transmitting region and the plurality of pixel driving circuit islands;

the connecting sections in the first group of circuitous connecting sections are symmetrically arranged about the second symmetry axis, and the connecting sections in the second group of circuitous connecting sections are symmetrically arranged about the second symmetry axis; and in a direction from close to the second symmetry axis to away from the second symmetry axis, a number of the connecting sections in the first group of circuitous connecting sections decreases, and a number of the connecting sections in the second group of circuitous connecting sections decreases.

In the above display device, the connecting sections of the plurality of first signal lines further comprise straight connecting sections, and a part of the straight connecting sections are connected between the pixel driving circuit islands in the first group of pixel driving circuit islands and corresponding ones of the pixel driving circuit islands in the second group of pixel driving circuit islands and are arranged on a side of the first group of circuitous connecting sections and the second group of circuitous connecting sections away from the display light-transmitting region.

In the above display device, another part of the straight connecting sections are connected between the connecting sections in the first group of circuitous connecting sections and the second group of circuitous connecting sections and the plurality of pixel driving circuit islands.

In the above display device, the display device further comprises a plurality of second signal lines, a number of the second signal lines electrically connected to at least part of the pixel driving circuit islands of the first group of pixel driving circuit islands decreases in the direction from close to the first symmetry axis to away from the first symmetry axis; and a number of the second signal lines electrically connected to at least part of the pixel driving circuit islands of the second group of pixel driving circuit islands decreases in the direction from close to the first symmetry axis to away from the first symmetry axis.

In the above display device, the first signal lines are data lines, and the second signal lines are selected from at least one kind of scan lines, reset lines, and light emission control signal lines.

In the above display device, a size of sub-pixels in each of the plurality of first display pixels is greater than a size of the sub-pixels in each of the plurality of the second display pixels.

An electronic equipment comprises the above display device and a photosensitive unit, and the photosensitive unit is arranged corresponding to the display light-transmitting region.

Advantageous Effect of Invention

Advantageous Effect

The present invention provides a display device and an electronic equipment, which avoid that a length of the connection sections of the first signal lines is too long, resulting in a large difference between an impedance of the first signal lines having the connection sections and an impedance of the first signal lines of the main display region, by arranging the connecting sections of the plurality of first signal lines between the plurality of pixel driving circuit islands and the display light-transmitting region to reduce lengths of the connecting sections of the plurality of first signal lines, thereby preventing a problem of uneven display in the main display region, and there is no need to change wiring when connecting the connecting sections of the plurality of first signal lines to the corresponding pixel driving circuit islands, which is beneficial to simplifying wiring designs of the plurality of first signal lines arranged around the display light-transmitting region.

BRIEF DESCRIPTION OF FIGURES

Description of Figures

Figure 1:
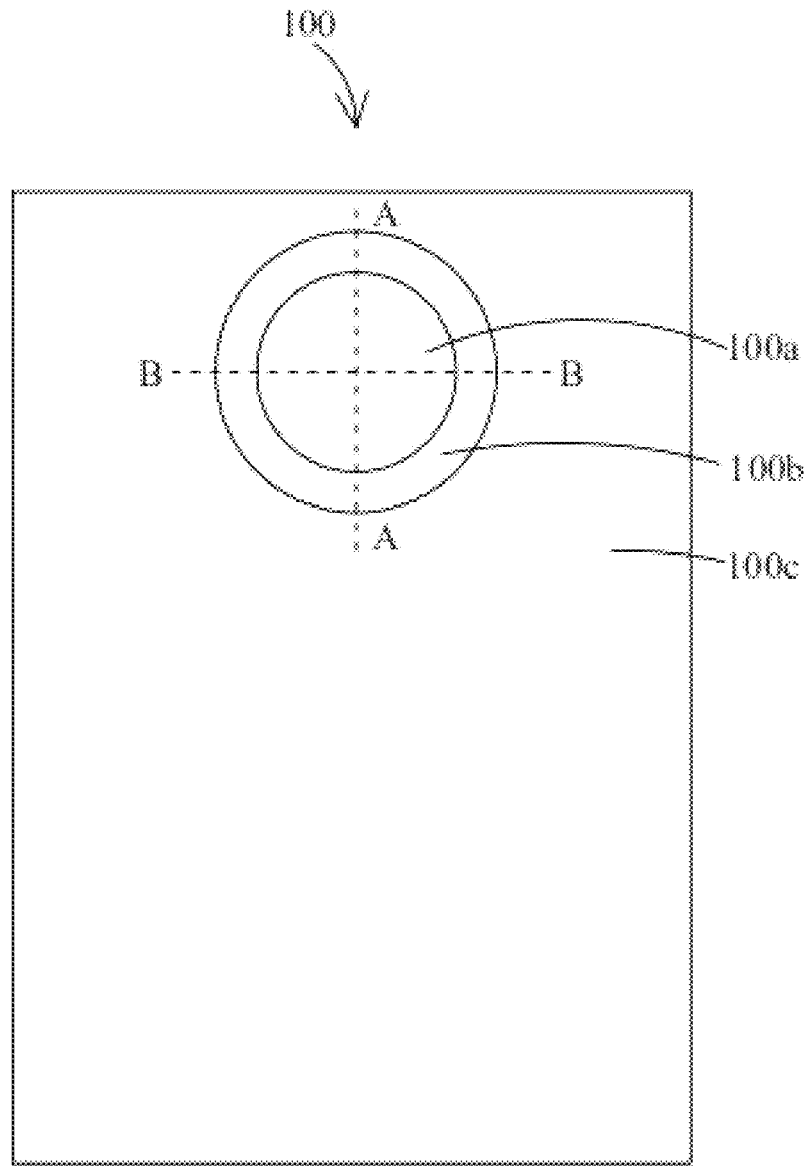

FIG. 1 is a schematic plan view of a display device according to an embodiment of the present invention.

Figure 2:
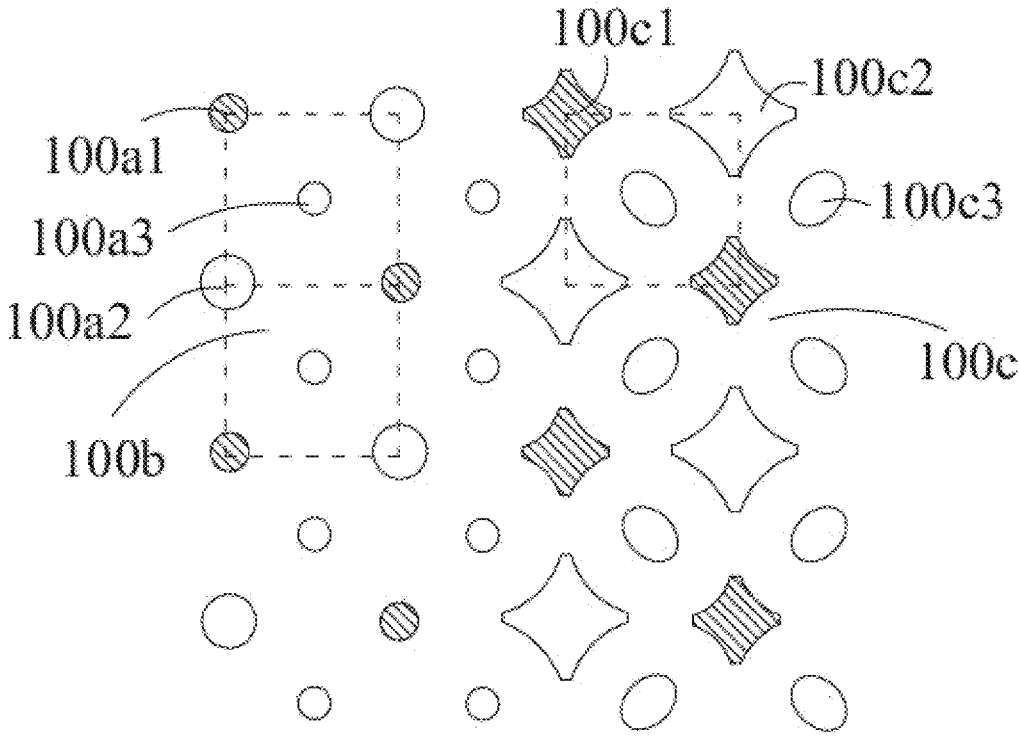

FIG. 2 is a schematic view of distribution of first display pixels and second display pixels in the display device shown in FIG. 1.

Figure 3:
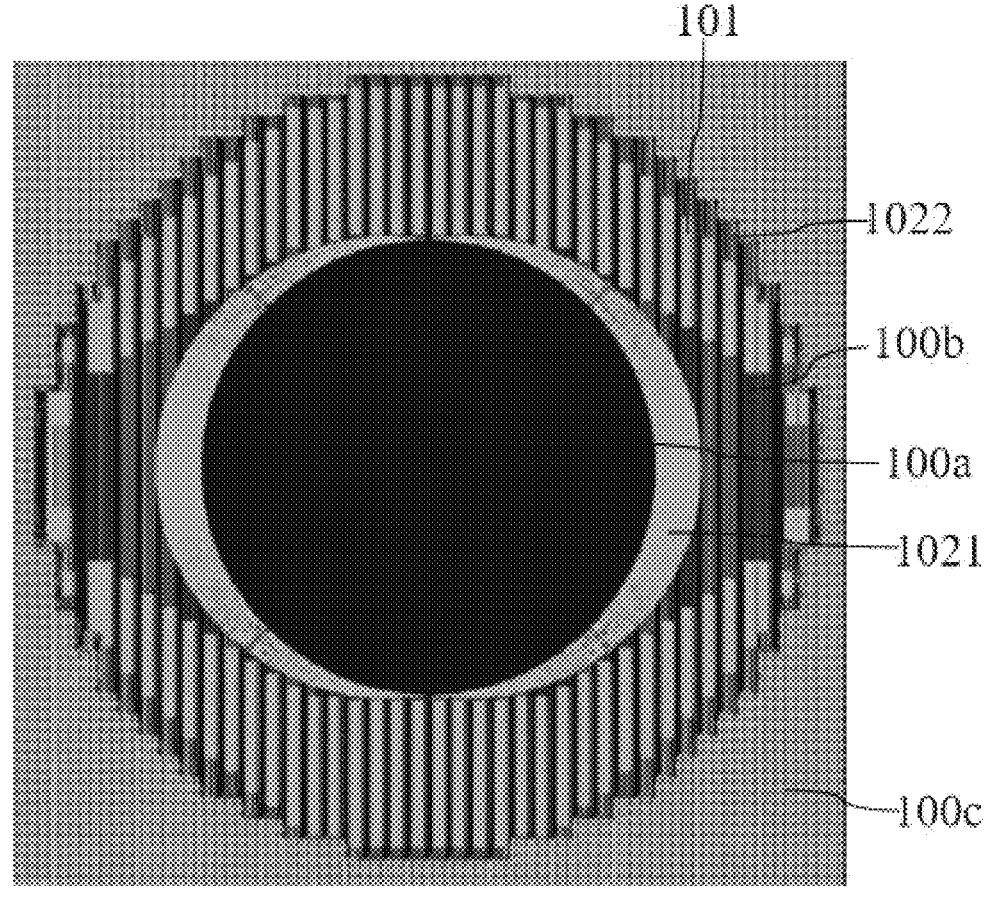

FIG. 3 is a first partial schematic view of the display device shown in FIG. 1.

Figure 4:
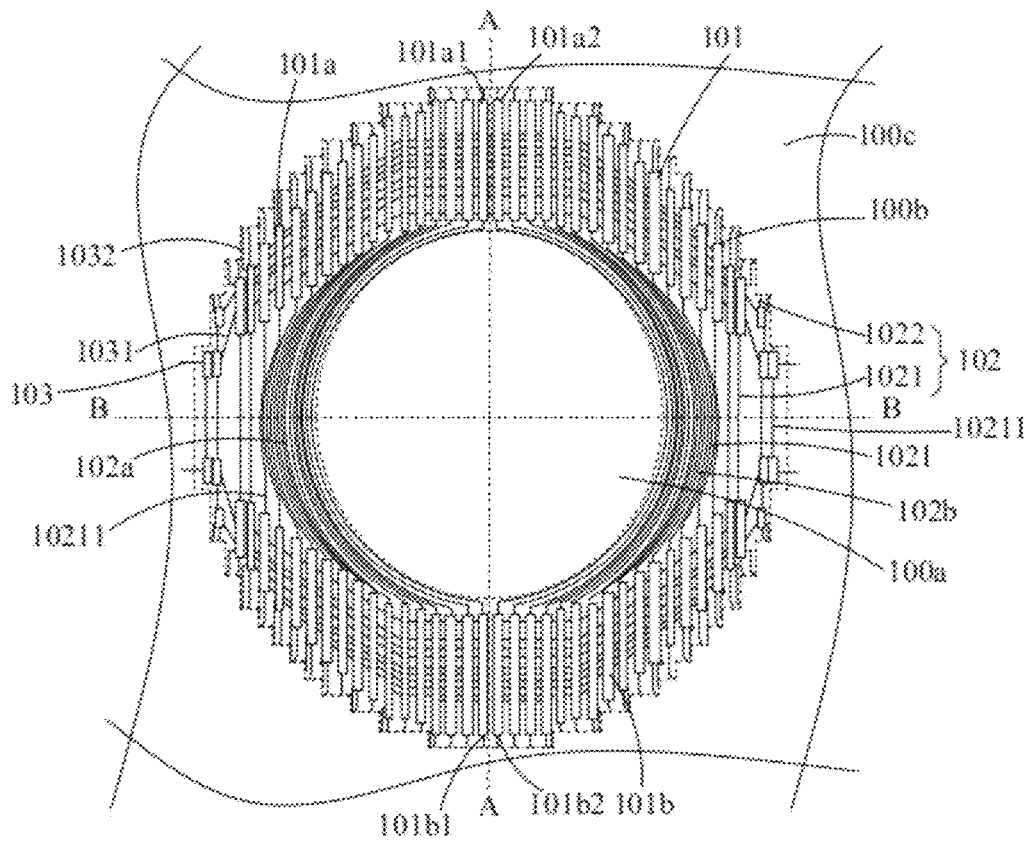

FIG. 4 is a partially enlarged schematic view of the display device shown in FIG. 1.

Figure 5:
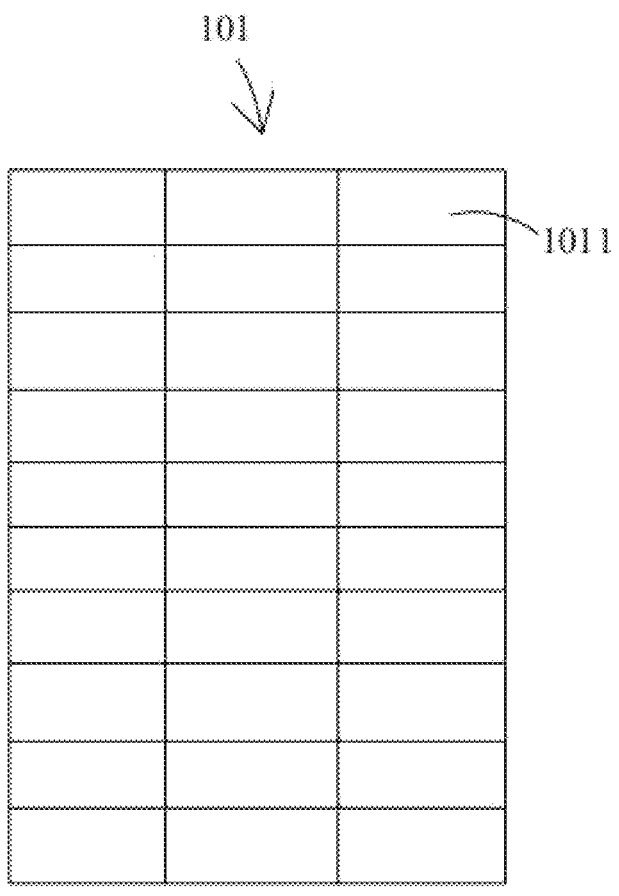

FIG. 5 is a schematic view of one pixel driving circuit island in FIG. 3.

Figure 6:
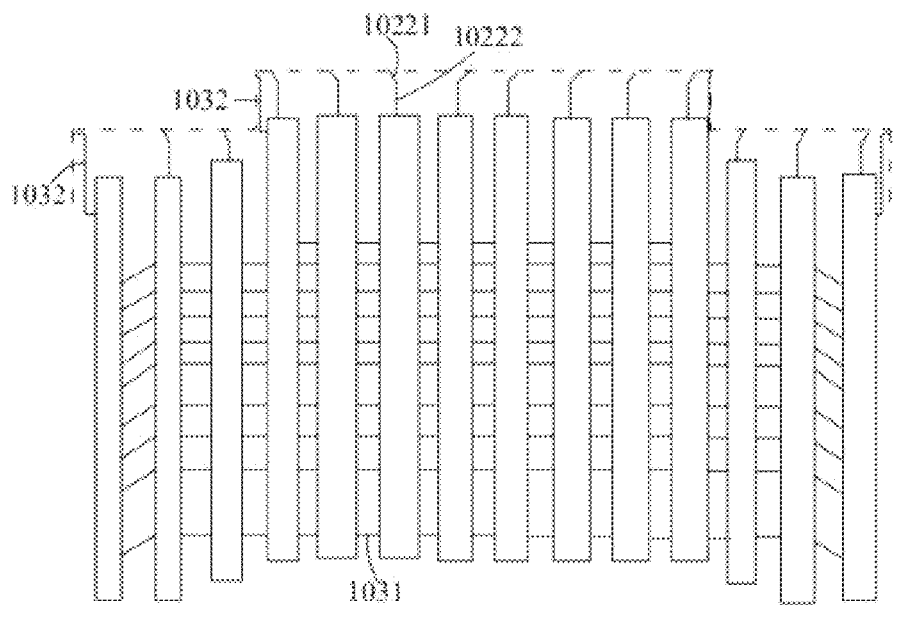

FIG. 6 is a partially enlarged schematic view of a junction of a main display region and a transition display region.

Figure 7:
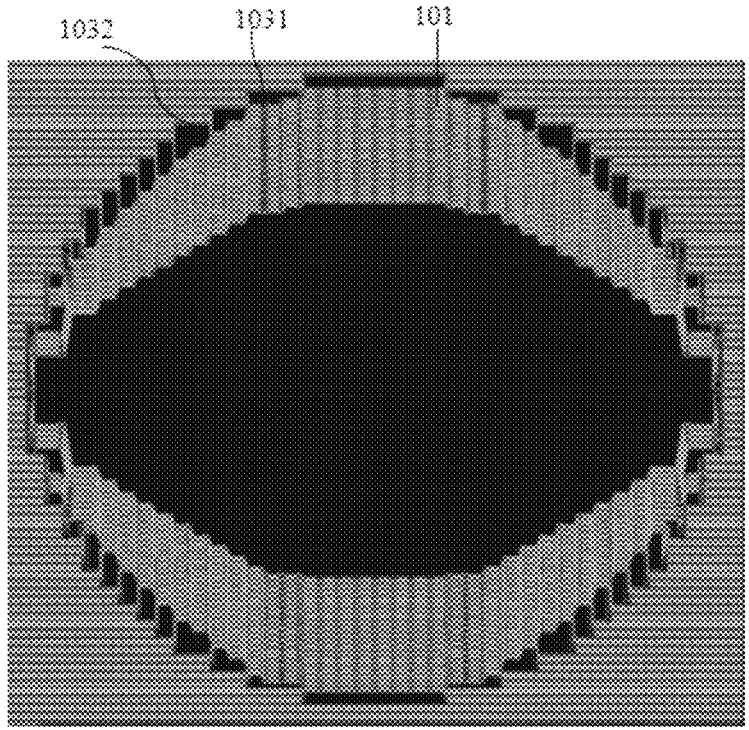

FIG. 7 is a second partial schematic view of the display device shown in FIG. 1.

EXAMPLES OF INVENTION

Embodiments of Invention

Type here a paragraph describing implementations of the present invention. The technical solutions in the embodiments of the present invention will be described clearly and completely hereinafter with reference to the accompanying drawings. It is apparent that the described embodiments are only a part of embodiments of the present invention, not all the embodiments. All other embodiments obtained by those skilled in the art based on the embodiments of the present invention belong to the protecting scope of the present invention.

The present invention provides a display device, the display device 100 may be a liquid crystal display device or an organic light-emitting diode display device. Specifically, the display device 100 is an organic light-emitting diode display device.

Referring to FIGS. 1 and 2, FIG. 1 is a schematic plan view of a display device according to an embodiment of the present invention, and FIG. 2 is a schematic view of distribution of first display pixels and second display pixels in the display device shown in FIG. 1. The display device 100 has a display light-transmitting region 100*a*, a main display region 100*c*, and a transition display region 100*b*. The display device 100 comprises a plurality of first display pixels, a plurality of first pixel driving circuits (not shown), a plurality of second display pixels, a plurality of pixel driving circuit islands, a plurality of first signal lines 102, and a plurality of second signal lines 103.

The transition display region 100*b* is arranged between the display light-transmitting region 100*a* and the main display region 100*c*. Both the main display region 100*c* and the transition display region 100*b* are configured to display. The display light-transmitting region 100*a* is configured to display, and it also has good light-transmitting characteristics. Light transmittance of the display light-transmitting region 100*a* is greater than light transmittance of the main display region 100*c* and the transition display region 100*b*. An area of the main display region 100*c* is larger than an area of the transition display region 100*b* and an area of the display light-transmitting region 100*a*.

The display light-transmitting region 100*a* has an arc-shaped boundary, and a shape of the display light-transmitting region 100*a* may be an ellipse, a circle, a chamfered square, or other shapes. The transition display region 100*b* is a ring. The transition display region 100*b* is any one of an elliptical ring, a circular ring, or a square ring.

Specifically, the shape of the display light-transmitting region 100*a* is a circle. The display light-transmitting region 100*a* is symmetrically arranged about a first symmetry axis A-A and a second symmetry axis B-B, and the first symmetry axis A-A is perpendicular to the second symmetry axis B-B. The transition display region 100*b* is a ring, and a boundary of the transition display region 100*b* close to the display light-transmitting region 100*a* is circle.

The plurality of first display pixels are uniformly arranged in the main display region 100*c*, and each first display pixel comprises a first red sub-pixel 100*c*1, a first green sub-pixel 100*c*3, and a first blue sub-pixel 100*c*2. The first red sub-pixel 100*c*1, the first green sub-pixel 100*c*3, and the first blue sub-pixel 100*c*2 are distributed in a PENTILE design in the main display region 100*c*. A shape of the first green sub-pixel 100*c*3 is an ellipse, and the first red sub-pixel 100*c*1 and the first blue sub-pixel 100*c*2 are octagonal.

The plurality of first pixel driving circuits are also arranged in the main display region 100*c*. One first pixel driving circuit correspondingly drives one sub-pixel (one of the first red sub-pixel 100*c*1, the first green sub-pixel 100*c*3, or the first blue sub-pixel 100*c*2) of the main display region 100*c* to emit light. The first pixel driving circuit can use any one of common 7T1C, 6T1C, 5T1C, 4T1C, 3T1C, or 2T1C. Each first pixel driving circuit comprises a plurality of metal film layers, and the plurality of first pixel driving circuits are arranged in the main display region 100*c* in an array, resulting in low light transmittance of the main display region 100*c*.

The plurality of second display pixels are uniformly arranged in the display light-transmitting region 100*a* and the transition display region 100*b*. Each second display pixel comprises a second red sub-pixel 100*a*1, a second green sub-pixel 100*a*3, and a second blue sub-pixel 100*a*2. The second red sub-pixel 100*a*1, the second green sub-pixel 100*a*3, and the second blue sub-pixel 100*a*2 are distributed in a PENTILE design in the display light-transmitting region 100*a* and the transition display region 100*b*. Shapes of the second red sub-pixel 100*a*1, the second green sub-pixel 100*a*3, and the second blue sub-pixel 100*a*2 are all circle.

A size of the first red sub-pixel 100*c*1 is larger than a size of the second red sub-pixel 100*a*1, a size of the first green sub-pixel 100*c*3 is larger than a size of the second green sub-pixel 100*a*3, and a size of the first blue sub-pixel 100*c*2 is larger than a size of the second blue sub-pixel 100*a*2, so as to ensure that the display light-transmitting region 100*a* has high light transmittance. Since the size of one second red sub-pixel 100*a*1 is different from the size of one first red sub-pixel 100*c*1, driving powers of driving circuits corresponding to the two sub-pixels are also different. Similarly, a driving power of the first green sub-pixel 100*c*3 and a driving power of the second green sub-pixel 100*a*3 are also different, and a driving power of the first blue sub-pixel 100*c*2 and a driving power of the second blue sub-pixel 100*a*2 are also different, so the first pixel driving circuit can only be configured to drive the first red sub-pixel 100*c*1, the green subpixel 100*c*3, and the first blue sub-pixel 100*c*2 of the main display region 100*c*, and it cannot be configured to drive the second red sub-pixel 100*a*1, the second green sub-pixel 100*a*3, and the second blue sub-pixel 100*a*2 of the transition display region 100*b* and the display light-transmitting region 100*a*. The size of the sub-pixels becomes smaller from the main display region 100*c* to the transition display region 100*b*.

As shown in FIGS. 3 to 5, FIG. 3 is a first partial schematic view of the display device shown in FIG. 1, FIG. 4 is a partially enlarged schematic view of the display device shown in FIG. 1, and FIG. 5 is a schematic view of one pixel driving circuit island in FIG. 3. The plurality of pixel driving circuit islands 101 are arranged in the transition display region 100*b*, each pixel driving circuit island 101 comprises a plurality of second pixel driving circuits 1011, and the second pixel driving circuits 1011 of the plurality of pixel driving circuit islands 101 are configured to drive the plurality of second display pixels to emit light; that is, the second pixel driving circuits 1011 of the plurality of pixel driving circuit islands 101 are configured to drive the second display pixels in the transition display region 100*b* to emit light, and they are also configured to drive the second display pixels in the display light-transmitting region 100*a* to emit light, so as to prevent the display light-transmitting region 100a from being provided with pixel driving circuits and prevent a metal film layer of the second pixel driving circuit 1011 from affecting light transmittance of the display light-transmitting region 100a, thereby further improving light transmittance of the display light-transmitting region 100a.

The second pixel driving circuit 1011 in the pixel driving circuit island 101 is electrically connected to the second display pixel in the display light-transmitting region 100a through transparent wirings, so as to further increase light transmittance of the display light-transmitting region 100a. A preparation material of the transparent wirings is selected from at least one of indium tin oxide or indium zinc oxide. The second pixel driving circuit 1011 in the pixel driving circuit island 101 and the second display pixel in the transition display region 100b may be electrically connected by metal wirings.

It should be noted that the pixel driving circuit island 101 refers to a plurality of second pixel driving circuits 1011 arranged together. A distance between two adjacent pixel driving circuit islands 101 is greater than a distance between two adjacent second pixel driving circuits 1011.

Unlike in the main display region 100c, one second pixel driving circuit 1011 can be configured to drive at least two of the plurality of second red sub-pixels 100a1, the plurality of second green sub-pixels 100a3, and the plurality of second blue sub-pixels 100a2, so as to reduce a number of the second pixel driving circuits 1011 and space occupied by the pixel driving circuit island 101, so that a size of the display light-transmitting region 100a can be increased or the transition display region 100b has more space. The second pixel driving circuit 1011 may be configured to drive sub-pixels emitting a same color light and/or sub-pixels emitting different color light in the plurality of second red sub-pixels 100a1, the plurality of second green sub-pixels 100a3, and the plurality of second blue sub-pixels 100a2. In the display light-transmitting region 100a, the sub-pixels driven by the same second pixel driving circuit 1011 are electrically connected by transparent wirings.

Specifically, two second red sub-pixels 100a1 are driven by a same second pixel driving circuit 1011, two second blue sub-pixels 100a2 are driven by a same second pixel driving circuit 1011, and four second green sub-pixels are driven by a same second pixel driving circuit 1011.

The plurality of first signal lines 102 extend from the main display region 100c to the transition display region 100b, and the plurality of second signal lines 103 extend from the main display region 100c to the transition display region 100b. The plurality of first signal lines 102 and the plurality of second signal lines 103 are not arranged in the display light-transmitting region 100a. A material of the plurality of first signal lines 102 and the plurality of second signal lines 103 is metal, and the metal includes, but are not limited to, molybdenum, aluminum, titanium, and copper. The plurality of first signal lines 102 and the plurality of second signal lines 103 are not arranged in the display light-transmitting region 100a, which further improves light transmittance of the display light-transmitting region 100a.

Specifically, the first signal line 102 is a data line, and the data line is configured to transmit data signals. The second signal line 103 is selected from at least one of scan lines, reset lines, and light emission control signal lines. The scan line is configured to transmit a scan signal, the reset line is configured to transmit a reset signal and/or an initialization signal, and the light emission control signal line is configured to transmit light emission control signals.

In the main display region 100c, the plurality of first signal lines 102 and the plurality of second signal lines 103 intersect perpendicularly, the plurality of first signal lines 102 are parallel to each other, and distance between any two adjacent first signal lines 102 is equal. Furthermore, the plurality of second signal lines 103 are parallel to each other and distance between any two adjacent second signal lines 103 is equal, and the plurality of second signal lines 103 perpendicularly intersect the plurality of first signal lines 102.

In the transition display region 100b, since the plurality of second pixel driving circuits 1011 constitute the plurality of pixel driving circuit islands 101, each pixel driving circuit island 101 is electrically connected to at least two of the plurality of first signal lines 102 and is electrically connected to at least two of the plurality of second signal lines 103, so that when the plurality of first signal lines 102 extend to the transition display region 100b, they need to be adjusted and divided into a plurality of groups of first signal lines 102. Each group of first signal lines 102 is connected to a pixel driving circuit island 101, and when the plurality of second signal lines 103 extend to the transition display region 100b, they need to be changed and divided into a plurality of groups, and each group of second signal lines 103 is connected to the plurality of pixel driving circuit islands 101 in series.

As shown in FIGS. 3 and 4, each first signal line 102 comprises a first connection section 1021, and the first connection sections 1021 of the plurality of first signal lines 102 are connected to the plurality of pixel driving circuit islands 101, so that the data signals are transmitted to the second pixel driving circuits 1011 of the plurality of pixel driving circuit islands 101, and the first connecting sections 1021 of the plurality of first signal lines 102 are arranged between the plurality of pixel driving circuit islands 101 and the display light-transmitting region 100a.

Compared with the Chinese patent application with a publication number CN110491917A, in which second circuitous sections of the plurality of second signal lines are arranged on a periphery of the pixel driving circuit islands, the second circuitous sections of the plurality of second signal lines need changing wirings to connect to corresponding pixel driving circuit islands, complexity of the wirings is increased, and lengths of the second circuitous sections of the plurality of second signal lines are greater, resulting in a larger difference in impedance between the second signal lines having the second circuitous section and the second signal lines of the main display region, thus causing uneven display in the main display region. In the present invention, the first connection sections 1021 of the plurality of first signal lines 102 are arranged between the plurality of pixel driving circuit islands 101 and the display light-transmitting region 100a, so that the first connection sections 1021 of the plurality of first signal lines 102 can be directly connected to the corresponding pixel driving circuit island 101 without changing wirings, so that the wiring complexity of the first connection section 1021 of the plurality of first signal lines 102 is reduced, and the first connection sections 1021 of the plurality of first signal lines 102 are arranged between the plurality of pixel driving circuit islands 101 and the display light-transmitting region 100a, so that the length of the first connection sections 1021 of the plurality of first signal lines 102 is reduced, and alleviate a problem that a length of the first connection sections 1021 of the plurality of first signal lines 102 is too great, resulting in a larger difference in impedance between the first signal line 102 with the first connecting section 1021 and the first signal line of the main display region 100c, thereby alleviating a problem that lengths of the first connection sections 1021 of the plurality of first signal lines 102 are too long, resulting in that a large difference of impedance between the first signal line 102 with the first connecting section 1021 and the first signal line of the main display region 100c, thereby relieving uneven display between the pixels connected to the first signal line 102 with the first connecting section 1021 and the pixels connected to the linear first signal line in main display region 100c.

With reference to FIG. 3 and FIG. 6, FIG. 6 is a partially enlarged schematic view of a junction of the main display region and the transition display region. Each first signal line 102 further comprises a first transition section 1022, the first transition sections 1022 of the plurality of first signal lines 102 are arranged between the plurality of pixel driving circuit islands 101 and the main display region 100c and are connected to the plurality of pixel driving circuit islands 101. On one hand, part of the first transition section 1022 of the first signal line 102 is adjusted relative to the first signal line 102 of the main display region 100c to adapt to a difference when the first signal line 102 is respectively connected to the first pixel driving circuit of the main display region 100c and the pixel driving circuit islands 101 of the transition display region 100b. A layout of the first transition section 1022 needs to occupy a space between the plurality of pixel driving circuit islands 101 and the main display region 100c for adjustment and further to be connected to the plurality of pixel driving circuit islands 101. On the other hand, the plurality of pixel driving circuit islands 101 are arranged closer to a center of the display light-transmitting region 100c to ensure that the second pixel driving circuit 1011 in the pixel driving circuit island 101 corresponding to the second display pixel at the center of the display light-transmitting region 100a can drive the second display pixel at the center position.

At least part of the first transition section 1022 comprises a sector section 10221 and a straight section 10222 connected to the sector section 10221. The sector sections 10221 of the plurality of first transition sections 1022 are gathered and distributed in a fan shape, narrowed into a group of first signal lines 102, and connected to the pixel driving circuit islands 101 through the straight sections 10222 of the plurality of first transition sections 1022.

The plurality of pixel driving circuit islands 101 are distributed around the display light-transmitting region 100a, so that the plurality of pixel driving circuit islands 101 adapt to a shape of the display light-transmitting region 100a, thereby reducing a distance between the second pixel driving circuits 1011 in the plurality of pixel driving circuit islands 101 and a corresponding sub-pixel, thus reducing an impedance of the wirings connecting the second pixel driving circuit 1011 and the corresponding sub-pixel and improving an uniformity of light emission of the second display pixels.

As shown in FIG. 4, the plurality of pixel driving circuit islands 101 comprise a first group of pixel driving circuit islands 101a and a second group of pixel driving circuit islands 101b. The pixel driving circuit islands 101 in the first group of pixel driving circuit islands 101a are distributed in an arc shape, the pixel driving circuit islands 101 in the second group of pixel driving circuit islands 101b are distributed in an arc shape, and the pixel driving circuit islands 101 in the first group of pixel driving circuit islands 101a and the pixel driving circuit islands 101 in the second group of pixel driving circuit islands 101b are symmetrically arranged along the second symmetry axis B-B. The pixel driving circuit islands 101 in the first group of pixel driving circuit islands 101a are symmetrically arranged about the first symmetry axis A-A. The pixel driving circuit islands 101 in the second group of pixel driving circuit islands 101b are symmetrically arranged about the first symmetry axis A-A. The connecting section of each first signal line 102 is connected between the pixel driving circuit island 101 in the first group of pixel driving circuit islands 101a and the corresponding pixel driving circuit island 101 in the second group of pixel driving circuit islands 101b, so that data signals can be transmitted between the pixel driving circuit island 101 in the first group of pixel driving circuit islands 101a and the corresponding pixel driving circuit island 101 in the second group of pixel driving circuit islands 101b.

A number of the second pixel driving circuits 1011 in at least part of the pixel driving circuit islands 101 of the first group of pixel driving circuit islands 101a decrease in a direction from close to the first symmetry axis A-A to away from the first symmetry axis A-A; and a number of the second pixel driving circuits 1011 in at least part of the pixel driving circuit islands 101 of the second group of pixel driving circuit islands 101b decreases in the direction from close to the first symmetry axis A-A to away from the first symmetry axis A-A, so that the pixel driving circuit island 101 comprising more pixel driving circuits 1011 can correspondingly drive more sub-pixels of the second display pixels, and the pixel driving circuit island 101 comprising fewer pixel driving circuit 1011 can correspondingly drive fewer sub-pixels of the second display pixels, so as to adapt to the following situation: the number of sub-pixels of the second display pixel in the display light-transmitting region 100a decreases from close to the first symmetry axis A-A to away from the first symmetry axis A-A, and when part of the second pixel driving circuit 1011 of the pixel driving circuit island 101 drives the second display pixel (the second display pixel directly below or directly above the pixel driving circuit island 101) corresponding to the pixel driving circuit island 101 in the light-transmitting region 100a, a number of sub-pixels of the display light-transmitting region 100c driven by a part of the pixel driving circuit island 101 decreases from close to the first symmetry axis A-A to away from the first symmetry axis A-A. The pixel driving circuit islands 101 in the first group of pixel driving circuit islands 101a and the corresponding pixel driving circuit island 101 in the second group of pixel driving circuit islands 101b are configured to drive the second display pixels located at, between, and near their positions.

Specifically, the plurality of pixel driving circuit islands 101 are in a strip shape, and the plurality of pixel driving circuit islands 101 are same in width. A height of at least part of the pixel driving circuit islands 101 of the first group of pixel driving circuit islands 101a decrease in the direction from close to the first symmetry axis A-A to away from the first symmetry axis A-A; and a height of at least part of the pixel driving circuit islands 101 of the second group of pixel driving circuit islands 101b decreases in the direction from close to the first symmetry axis A-A to away from the first symmetry axis A-A. A width of each pixel driving circuit island 101 may be 60 μm-100 μm, for example, the width is 70 μm.

A part of adjacent pixel driving circuit islands 101 in the first group of pixel driving circuit islands 101a close to the first symmetry axis A-A are same in height, and a part of adjacent pixel driving circuit islands 101 in the second group of pixel driving circuit islands 101b close to the first symmetry axis A-A are same in height, so as to adapt to the following situation: the transition display region 100b close to the first symmetry axis A-A has a same number of second display pixels in the corresponding position of the display light-transmitting region 100a, and a number of subpixels of the second display pixels driven by the pixel driving circuit island 101 is same.

Spacings between any two adjacent pixel driving islands of at least part of the pixel driving circuit islands 101 in the first group of pixel driving circuit islands 101a are equal; and spacings between any two adjacent pixel driving islands of the pixel driving circuit islands 101 in the second group of pixel driving circuit islands 101b are equal.

Specifically, a distance between two adjacent pixel driving circuit islands 101 in the first group of pixel driving circuit islands 101a and the second group of pixel driving circuit islands 101b, which are close to the first symmetry axis A-A, is 50 μm-70 μm; for example, the distance is 60 μm.

A distance between at least part of the pixel driving circuit islands 101 in the first group of pixel driving circuit islands 101a and the corresponding pixel driving circuit islands 101 in the second group of pixel driving circuit islands 101b decreases gradually in the direction from close to the first symmetry axis A-A to away from the first symmetry axis A-A, so that when the plurality of pixel driving circuit islands 101 are arranged around the display light-transmitting region 100a, they adapt to the circular design of the display light-transmitting region 100a, and it is beneficial to shorten a length of the first signal line 102 connecting the pixel driving circuit island 101 in the first group of pixel driving circuit islands 101a and the corresponding pixel driving circuit island 101 in the second group of pixel driving circuit islands 101b, thus preventing a long length of the connecting section 1021 of the first signal line 102 cause a large impedance and in turn affects the display effect.

The first group of pixel driving circuit islands 101a comprises a first pixel driving circuit island 101a1 and a second pixel driving circuit island 101a2 that are adjacent to the first symmetry axis A-A and adjacently arranged, the second group of pixel driving circuit islands 101b comprises a third pixel driving circuit island 101b1 arranged corresponding to the first pixel driving circuit island 101a1 and a fourth pixel driving circuit island 101b2 arranged corresponding to the second pixel driving circuit island 101a2, and a spacing between the first pixel driving circuit island 101a1 and the third pixel driving circuit island 101b1 is equal to a spacing between the second pixel driving circuit island 101a2 and the fourth pixel driving circuit island 101b2. A number of second pixel driving circuits 1011 included in the first pixel driving circuit island 101a1 is same as a number of second pixel driving circuits 1011 included in the third pixel driving circuit island 101b1. A number of second pixel driving circuits 1011 included in the second pixel driving circuit island 101a2 is same as a number of second pixel driving circuits 1011 included in the fourth pixel driving circuit island 101b2.

The connecting sections 1021 of the plurality of first signal lines 102 comprise a first group of circuitous connecting sections 102a and a second group of circuitous connecting sections 102b, the first group of circuitous connecting sections 102a and the second group of circuitous connecting sections 102b are arranged on opposite sides of the display light-transmitting region 100a and are symmetrically arranged about the first symmetry axis A-A, the first group of circuitous connecting sections 102a and the second group of circuitous connecting sections 102b are both arranged around the display light-transmitting region 100a, and the first group of circuitous connecting sections 102a and the second group of circuitous connecting sections 102b are both arranged between the display light-transmitting region 100a and the plurality of pixel driving circuit islands 101, the first connecting sections 1021 in the first group of circuitous connecting sections 102a are symmetrically arranged about the second symmetry axis B-B, and the first connecting sections 1021 in the second group of circuitous connecting sections 102b are symmetrically arranged about the second symmetry axis B-B. The first connecting section 1021 in the first group of circuitous connecting sections 102a and the first connecting section 1021 in the second group of circuitous connecting sections 102b are both arcs, so that the first signal lines 102 are arranged to prevent the display light-transmitting region 100a, meanwhile, a shape of the first connecting section 1021 in the first group of circuitous connecting sections 102a and the first connecting section 1021 in the second group of circuitous connecting sections 102b are adapted to a shape of the display light-transmitting region 100a, so that the length of the first connecting section 1021 is minimized, and the difference between the length of the first signal line 102 of the first connection section 1021 comprising the first group of circuitous connecting sections 102a and the second group of circuitous connecting sections 102b and the length of the first signal line 102 of the main display region 100c is reduced, and further alleviate the problem of uneven display in the main display region 100c due to the impedance difference is relieved to the greatest extent.

In a direction from close to the second symmetry axis B-B to away from the second symmetry axis B-B, a number of first connecting sections 1021 in the first group of circuitous connecting sections 102a decreases, and a number of first connecting sections 1021 in the second group of circuitous connecting sections 102b decreases, so that the pixel driving circuit island 101 close to the first symmetry axis A-A in the first group of pixel driving circuit islands 101a and the corresponding pixel driving circuit island 101 in the second group of pixel driving circuits 101b are connected by an arc-shaped first connecting section 1021 having a longer length, and the pixel driving circuit island 101 in the first group of pixel driving circuit islands 101a far away from the first symmetry axis AA and the corresponding pixel driving circuit island 101 in the second group of pixel driving circuit islands 101b are connected by an arc-shaped first connecting section 1021 having a shorter length, so that a plurality of first connecting sections 1021 are connected in series to the pixel driving circuit island 101 in the first group of pixel driving circuit islands 101a and the corresponding pixel driving circuit island 101 in the second group of pixel driving circuits 101b, meanwhile, lengths of the plurality of first connecting sections 1021 is minimized, thereby relieving the display difference of the main display region 100c and preventing short circuits between the plurality of first connecting sections 1021.

The first connecting sections 1021 of the plurality of first signal lines 102 further comprise straight connecting sections 10211, and a part of the straight connecting sections 10211 is connected between the pixel driving circuit islands 101 in the first group of pixel driving circuit islands 101a and corresponding ones of the pixel driving circuit islands 101 in the second group of pixel driving circuit islands 101b and are arranged on a side of the first group of circuitous connecting sections 102a and the second group of circuitous connecting sections 102b away from the display light-transmitting region 100a. Compared with the second circuitous sections of the plurality of second signal lines, all of which are winding designs, in the background art, some of the connecting sections in the present invention are straight connecting sections, which further relieves the problem of uneven display caused by the impedance difference of the first signal line.

The other part of the straight connecting section 10211 is connected between the first connecting sections 1021 of the first group of circuitous connecting sections 102a and the second group of circuitous connecting sections 102b and the plurality of pixel driving circuit islands 101, so as to further shorten lengths of the first connection sections 1021 of the plurality of first signal lines 102, and to further reduce the impedance difference of the first signal lines, and to further relieves the uneven display of the main display region 100c.

With reference to FIGS. 4, 6, and 7, FIG. 7 is a second partial schematic diagram of the display device shown in FIG. 1. The second signal lines 103 extending to the transition display region 100b is divided into multiple groups, and each group is connected in series with a corresponding pixel driving circuit island 101, allowing scanning signals to be transmitted to the pixel driving circuit islands 101 connected in series. Each second signal line 103 comprises a second connecting section 1031 connecting two adjacent pixel driving circuit islands 101 in the first group of pixel driving circuit islands 101a and the second group of pixel driving circuit islands 101b, and the second connecting section 1031 may be a straight line, a polyline, or an arc. Each second signal line 103 further comprises a second transition section 1032, and the second transition sections 1032 of the plurality of second signal lines 103 are arranged between the plurality of pixel driving circuit islands 101 and the main display region 100c.

A number of second signal lines 103 electrically connected to at least part of the pixel driving circuit islands 101 in the first group of pixel driving circuit islands 101a decreases in the direction from close to the first symmetry axis A-A to away from the first symmetry axis A-A; and a number of second signal lines 103 electrically connected to at least part of the pixel driving circuit islands 101 of the second group of pixel driving circuit islands 101b decreases in the direction from close to the first symmetry axis A-A to away from the first symmetry axis A-A, thus part of the pixel driving circuit islands 101 close to the first symmetry axis A-A include more second pixel driving circuits 1011, and pixel driving circuit islands 101 far away from the first symmetry axis A-A include fewer second pixel driving circuits 1011.

The present invention further provides an electronic equipment comprising the display device 100 and a photosensitive unit, and the photosensitive unit is arranged corresponding to the display light-transmitting region 100a. The photosensitive unit may be a camera, an optical touch component, and an optical fingerprint recognition sensor, etc. Specifically, the photosensitive unit is a camera. The display light-transmitting region 100a has high light transmittance, which can reduce light interference and diffraction, and is beneficial to improving a photographing effect of the electronic equipment.

The description of the above embodiments is only used to help understanding the technical solutions of the present invention and its core concept. Those skilled in the art should understand that they may still make modifications to the technical solutions described in the foregoing embodiments or make equivalent replacements to some or all technical features thereof, without departing from the scope of the technical solutions of the embodiments of the present invention.

What is claimed is:

1. A display device, comprising a display light-transmitting region, a main display region, and a transition display region, wherein the transition display region is arranged between the display light-transmitting region and the main display region, the display device further comprising:
   a plurality of first display pixels provided in the main display region;
   a plurality of second display pixels provided in the display light-transmitting region and the transition display region;
   a plurality of pixel driving circuit islands provided in the transition display region and arranged around the display light-transmitting region, wherein each of the plurality of pixel driving circuit islands comprises a plurality of pixel driving circuits, and the pixel driving circuits of the plurality of pixel driving circuit islands are configured to drive the plurality of second display pixels to emit light; and
   a plurality of first signal lines, wherein each of the plurality of first signal lines comprises a connecting section, and the connecting sections of the plurality of first signal lines are disposed within an area surrounded by the plurality of pixel driving circuit islands, and between the plurality of pixel driving circuit islands and the display light-transmitting region, and are connected to the plurality of pixel driving circuit islands.

2. The display device as claimed in claim 1, wherein each of the plurality of first signal lines further comprises a transition section, and the transition sections of the plurality of first signal lines are disposed between the plurality of pixel driving circuit islands and the main display region and are connected to the plurality of pixel driving circuit islands.

3. The display device as claimed in claim 1, wherein the display light-transmitting region is symmetrically arranged about a first symmetry axis and a second symmetry axis, and the first symmetry axis is perpendicular to the second symmetry axis;
   the plurality of pixel driving circuit islands comprise a first group of pixel driving circuit islands and a second group of pixel driving circuit islands, and the pixel driving circuit islands in the first group of pixel driving circuit islands and the pixel driving circuit islands in the second group of pixel driving circuit islands are symmetrically arranged about the second symmetry axis;
   the pixel driving circuit islands in the first group of pixel driving circuit islands are symmetrically arranged about the first symmetry axis, and the pixel driving circuit islands in the second group of pixel driving circuit islands are symmetrically arranged about the first symmetry axis; and
   wherein the connecting section of each of the plurality of first signal lines is connected between one of the pixel driving circuit islands in the first group of pixel driving circuit islands and a corresponding pixel driving circuit island in the second group of pixel driving circuit islands.

4. The display device as claimed in claim 3, wherein the display light-transmitting region has an arc-shaped boundary, and a number of the pixel driving circuits in at least part of the pixel driving circuit islands of the first group of pixel driving circuit islands decreases in a direction from close to the first symmetry axis to away from the first symmetry axis; and
   a number of the pixel driving circuits in at least part of the pixel driving circuit islands of the second group of pixel driving circuit islands decreases in the direction from close to the first symmetry axis to away from the first symmetry axis.

5. The display device as claimed in claim 4, wherein the plurality of pixel driving circuit islands are in a strip shape, and the plurality of pixel driving circuit islands are same in width;

a height of at least part of the pixel driving circuit islands of the first group of pixel driving circuit islands decreases in the direction from close to the first symmetry axis to away from the first symmetry axis; and a height of at least part of the pixel driving circuit islands of the second group of pixel driving circuit islands decreases in the direction from close to the first symmetry axis to away from the first symmetry axis.

6. The display device as claimed in claim 3, wherein part of adjacent pixel driving circuit islands in the first group of pixel driving circuit islands close to the first symmetry axis are same in height, and part of adjacent pixel driving circuit islands in the second group of pixel driving circuit islands close to the first symmetry axis are same in height.

7. The display device as claimed in claim 3, wherein spacings between any two adjacent pixel driving islands of at least part of the pixel driving circuit islands in the first group of pixel driving circuit islands are equal; and spacings between any two adjacent pixel driving islands of at least part of the pixel driving circuit islands in the second group of pixel driving circuit islands are equal.

8. The display device as claimed in claim 3, wherein spacings between at least part of the pixel driving circuit islands in the first group of pixel driving circuit islands and corresponding pixel driving circuit islands in the second group of pixel driving circuit islands decrease in a direction from close to the first symmetry axis to away from the first symmetry axis.

9. The display device as claimed in claim 8, wherein the first group of pixel driving circuit islands comprise a first pixel driving circuit island and an adjacently arranged second pixel driving circuit island that are adjacent to the first symmetry axis, the second group of pixel driving circuit islands comprise a third pixel driving circuit island arranged corresponding to the first pixel driving circuit island and a fourth pixel driving circuit island arranged corresponding to the second pixel driving circuit island, and a spacing between the first pixel driving circuit island and the third pixel driving circuit island is equal to a spacing between the second pixel driving circuit island and the fourth pixel driving circuit island.

10. The display device as claimed in claim 3, wherein a shape of the display light-transmitting region is circle, the connecting sections of the plurality of first signal lines comprise a first group of circuitous connecting sections and a second group of circuitous connecting sections, the first group of circuitous connecting sections and the second group of circuitous connecting sections are arranged on opposite sides of the display light-transmitting region and are symmetrically arranged about the first symmetry axis, the first group of circuitous connecting sections and the second group of circuitous connecting sections are both arranged around the display light-transmitting region, and the first group of circuitous connecting sections and the second group of circuitous connecting sections are both arranged between the display light-transmitting region and the plurality of pixel driving circuit islands;

the connecting sections in the first group of circuitous connecting sections are symmetrically arranged about the second symmetry axis, and the connecting sections in the second group of circuitous connecting sections are symmetrically arranged about the second symmetry axis; and in a direction from close to the second symmetry axis to away from the second symmetry axis, a number of the connecting sections in the first group of circuitous connecting sections decreases, and a number of the connecting sections in the second group of circuitous connecting sections decreases.

11. The display device as claimed in claim 10, wherein the connecting sections of the plurality of first signal lines further comprise straight connecting sections, and part of the straight connecting sections are connected between the pixel driving circuit islands in the first group of pixel driving circuit islands and corresponding pixel driving circuit islands in the second group of pixel driving circuit islands and are arranged on a side of the first group of circuitous connecting sections and the second group of circuitous connecting sections away from the display light-transmitting region.

12. The display device as claimed in claim 11, wherein another part of the straight connecting sections are connected between the connecting sections in the first group of circuitous connecting sections and the second group of circuitous connecting sections and the plurality of pixel driving circuit islands.

13. The display device as claimed in claim 4, wherein the display device further comprises a plurality of second signal lines;

a number of the second signal lines electrically connected to at least part of the pixel driving circuit islands of the first group of pixel driving circuit islands decreases in the direction from close to the first symmetry axis to away from the first symmetry axis; and a number of the second signal lines electrically connected to at least part of the pixel driving circuit islands of the second group of pixel driving circuit islands decreases in the direction from close to the first symmetry axis to away from the first symmetry axis.

14. The display device as claimed in claim 13, wherein the first signal lines are data lines, and the second signal lines are selected from at least one of scan lines, reset lines, and light emission control signal lines.

15. The display device as claimed in claim 1, wherein a size of subpixels in each of the plurality of first display pixels is larger than a size of sub-pixels in each of the plurality of the second display pixels.

16. The display device as claimed in claim 3, wherein the pixel driving circuit islands in the first group of pixel driving circuit islands are arranged in an arc shape, and the pixel driving circuit islands in the second group of pixel driving circuit islands are arranged in an arc shape.

17. An electronic equipment, comprising the display device according to claim 1 and a photosensitive unit, wherein the photosensitive unit is arranged corresponding to the display light-transmitting region.

* * * * *